INVENTOR.
ROBERT S. BRADSHAW
BY William R. Nolte
AGENT

MASK AND SUBSTRATE ALIGNMENT APPARATUS

Filed Feb. 25, 1964 6 Sheets-Sheet 2

INVENTOR.
ROBERT S. BRADSHAW
BY
William R. Nolte
AGENT

April 4, 1967 R. S. BRADSHAW 3,312,190

MASK AND SUBSTRATE ALIGNMENT APPARATUS

Filed Feb. 25, 1964 6 Sheets-Sheet 3

INVENTOR.
ROBERT S. BRADSHAW

BY

William R. Nolte

AGENT

MASK AND SUBSTRATE ALIGNMENT APPARATUS

Filed Feb. 25, 1964 6 Sheets-Sheet 4

INVENTOR.
ROBERT S. BRADSHAW
BY
William R. Nolte
AGENT

April 4, 1967 R. S. BRADSHAW 3,312,190

MASK AND SUBSTRATE ALIGNMENT APPARATUS

Filed Feb. 25, 1964 6 Sheets-Sheet 5

INVENTOR.
ROBERT S. BRADSHAW
BY
William R. Nolte
AGENT

INVENTOR.
ROBERT S. BRADSHAW
BY
William R. Nolte
AGENT

United States Patent Office 3,312,190
Patented Apr. 4, 1967

3,312,190

MASK AND SUBSTRATE ALIGNMENT APPARATUS

Robert S. Bradshaw, Broomall, Pa., assignor to Burroughs Corporation, Detroit, Mich., a corporation of Michigan Filed Feb. 25, 1964, Ser. No. 347,174
15 Claims. (Cl. 118—49.1)

This invention relates to vacuum deposition apparatus for producing complex multiple-layer film structure, and more particularly, to such apparatus for facilitating the alignment of mask elements and substrates or workpieces used to produce such complex film structures for electronic and micro-electronic circuits. The present invention may be used in conjunction with, and constitutes an improvement over, the invention described in the copending application entitled, Electronic Circuit Fabrication Apparatus, by Simmons et al., Ser. No. 238,165, filed Nov. 16, 1962, and assigned to the same assignee as the present invention.

The development of thin film micro-electronic devices often requires the vacuum deposition of various materials onto a substrate, with the requirement that each deposition be accurately registered with respect to the other depositions. Each deposition is performed through a mask and in certain forms of such apparatus there are as many masks as there are deposition steps. To compound the difficulty, it is found that on occasion the temperature of the substrate and surrounding parts will vary between subsequent depositions. Prior art systems using masks and substrates fixed to surrounding structural members are particularly sensitive to registration errors resulting from unequal expansion coefficients as the temperature varies. In addition, variations in substrate thickness have increased the errors of deposition.

It is an object of this invention therefore, to provide an improved vacuum deposition apparatus facilitating mask and substrate alignment and which avoids one or more of the disadvantages of the prior art arrangements.

The vacuum deposition apparatus of the present invention may in one form thereof be utilized in a vacuum chamber in which successive depositions of different materials on a substrate are accomplished by means of a multiple heater turret carrying a plurality of filaments or boat heaters. Each heater is provided with a high current feed-through into the chamber for vapor deposition of electrically conductive structures on a dielectric substrate. A plurality of masks are arranged relative to the turret heater so that a selected mask and filament may be rotated to be in alignment with a substrate mounted in a holder so that evaporant material from the heater is passed through the mask and onto the substrate. The vacuum deposition apparatus includes means for supporting and aligning the mask, means for supporting and aligning a substrate, the supporting means including a body for heating and cooling the substrate, means associated with the body means for holding the substrate adjacent a surface of the body means, means for permitting expansion and contraction of the body means, means providing a coarse registration of a mask with a selected substrate, and means for bodily moving the selected mask from its carrier and into exact registration with the substrate holder.

For a better understanding of the present invention, together with other and further objects thereof, reference is had to the following description taken in conjunction with the accompanying drawings and its scope will be pointed out in the appended claims.

Figure 1:
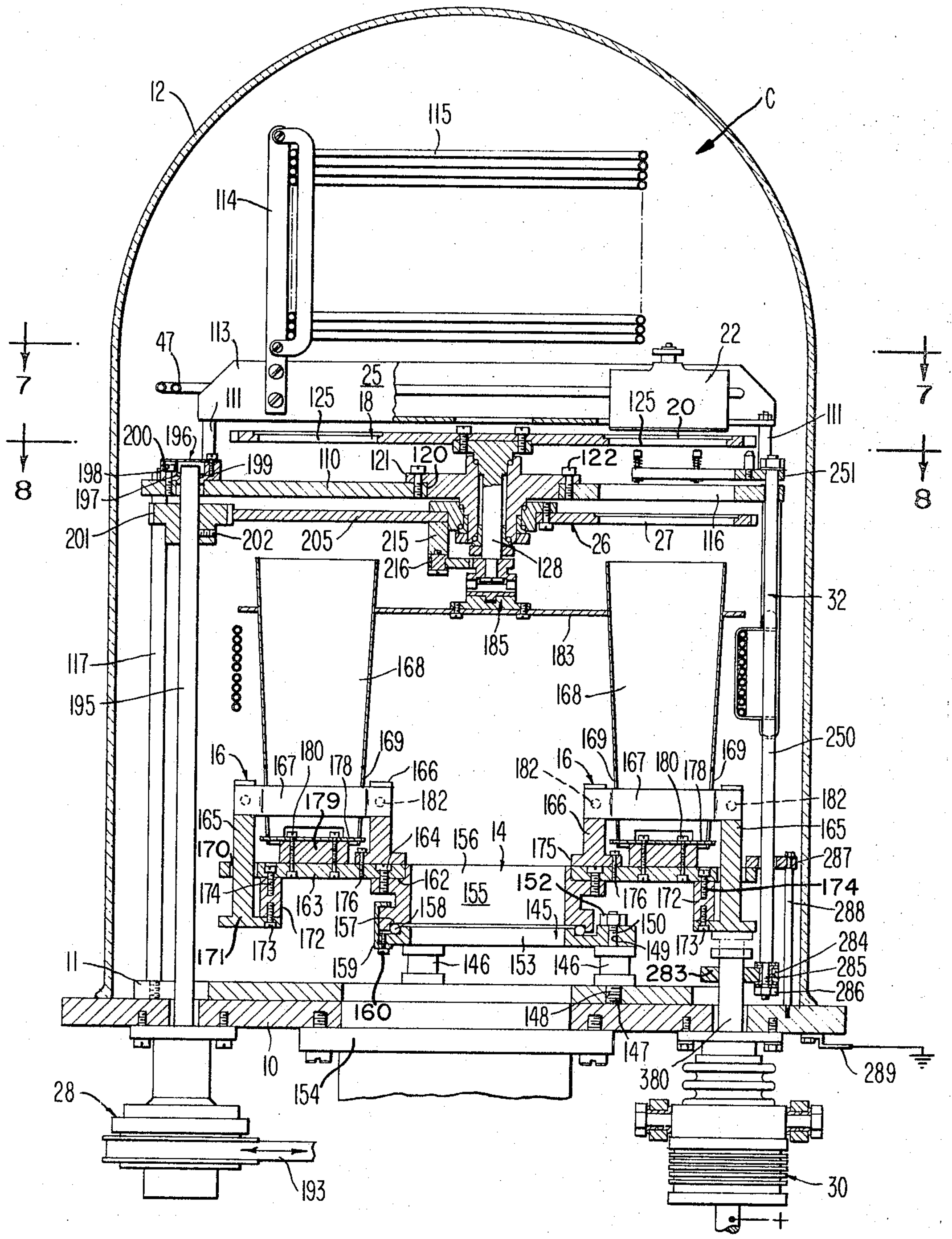
FIGURE 1 is an elevational view partially in section illustrating a preferred embodiment of the invention.

Referring first to FIGURE 1 of the drawings it can be seen that the present apparatus for vapor deposition of multiple-layer film structures comprises a number of subassemblies which are operable to perform certain functions within a vacuum chamber C defined by a composite base 10, and a bell-jar top 12. The subassemblies are suitably supported upon the base and include a heater turret assembly 14 which comprises a plurality of heater units 16, the latter arranged in a radial manner to permit sequential vapor deposition of different materials supported thereby. A mask assembly 18 carrying a plurality of mask elements 20, one for each heater unit, is mounted in bearings and is coupled to the heater assembly to rotate in unison therewith. A workpiece holder assembly 22 engaging workpiece or substrate 24 therein is mounted on channel platform 25 above the heater assembly so that evaporant material from a given heater unit when properly indexed may pass through the shield assembly 26 and an associated mask element 20. The shield assembly 26 is mounted for relative movement between the heater and mask assemblies and in one position thereof blocks or prevents the evaporant from striking the substrate but in another position thereof aperture 27 contained therein is aligned with the heater unit 16 and permits the evaporant to pass through mask element 20 to strike the substrate 24.

A rotary magnet feed-through assembly 28 actuatable from without the vacuum assembly is provided to index the heater and mask assemblies so that a desired heater unit 16 and mask element 20 are aligned beneath the substrate. An electrical feed-through assembly 30 is also provided for making and breaking a high electrical current contact to a selected heater unit. A mask element ratchet drive lifting assembly 32 associated with the electrical feed-through assembly is actuated simultaneously therewith to lift the selected mask element into close facing relationship with the substrate. During initial warm-up of a heater unit the shield assembly 26 is positioned to block the rising evaporant from heater unit 16 to prevent contamination. After initial warm-up and upon the heater unit reaching proper operating temperature, the shield assembly may be moved out of blocking relationship by the ratchet drive assembly 32 associated with the rotary magnet feed-through drive to permit the evaporant to be deposited on the substrate 24. When the vapor deposition has occurred for the desired interval of time, the shield assembly may again be interposed between the substrate and the heater material, to interrupt the deposition of the evaporant on the substrate.

Figure 2:
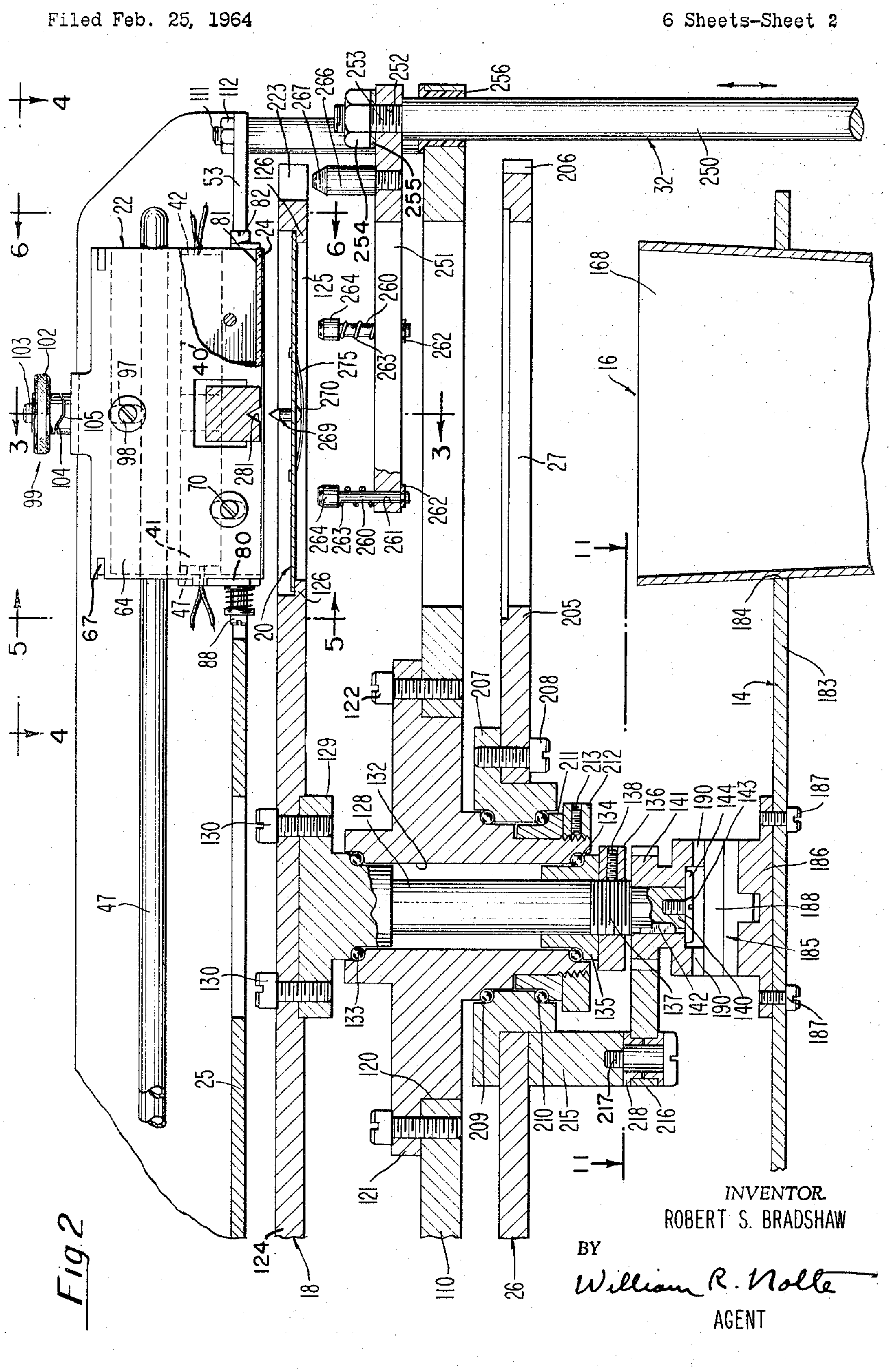
FIGURE 2 is an enlarged sectional view of an upper portion of the apparatus of the invention.
Figure 3:
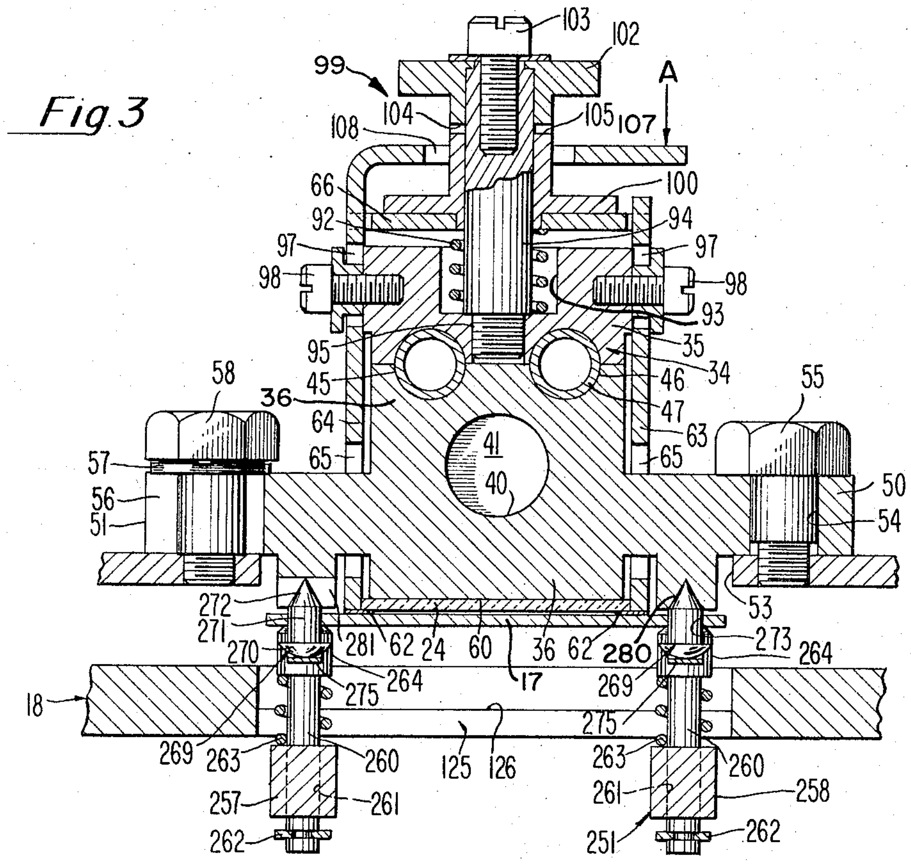
FIGURE 3 is a sectional view taken through the substrate holder along the line 3—3 of FIGURE 2.
Figure 5:
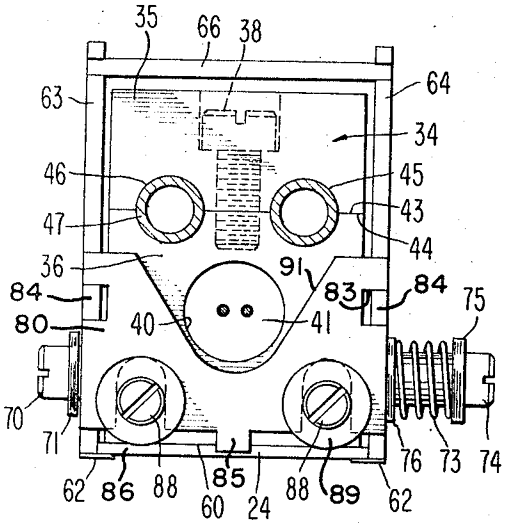
FIGURE 5 is a view partially in section taken along the line 5—5 of FIGURE 2 illustrating an end portion of the substrate holder.
Figure 6:
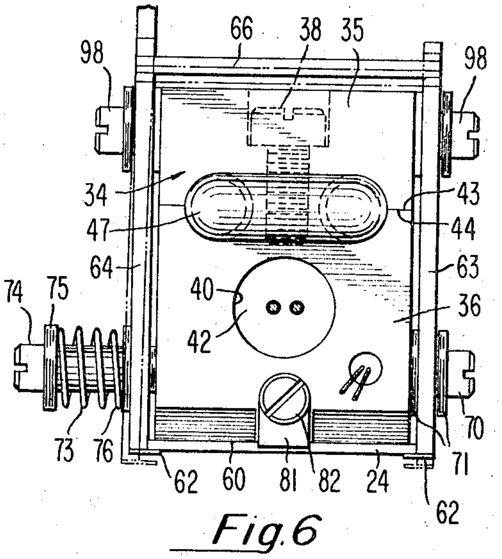
FIGURE 6 is a view partially in section taken along the line 6—6 of FIGURE 2 illustrating the opposite end portion of the substrate holder.

Referring now to FIGURES 2 and 3, the previously referred to substrate or work piece holder assembly 22 includes a body 34 having upper and lower members 35, 36 which are joined by means of screws 38 in FIGURES 5 and 6. The lower body portion 36 includes a large central aperture 40 extending throughout its length FIGURE 2, and within which is received two cartridge type electrical resistance heaters 41, 42 at opposite ends thereof. The contacting surfaces 43, 44 of the top and bottom body portions include and define a pair of grooves 45 and 46, FIGURES 3 and 5, which receive and are arranged to clamp over a loop of tubing 47 through which a cooling fluid such as liquid nitrogen flows. This arrangement permits the temperature of the substrate holder and the substrate 24 to be raised above or lowered below the ambient temperature. Prior to depositing evaporant material on the substrate 24, which may be of a material such as glass, quartz, ceramic or other refractory material, the same must be brought up to a suitable high temperature to drive off any impurities thereon. In addition, having the substrate at a suitable temperature with respect to the material being evaporated thereon makes the same more acceptable to receive the evaporant. The heater element associated with the lower base of the holder may be brought up to a very high temperature of the order of 500 or 600° C. This insures a very clean deposit and is effective to bake out the surface of the substrate so as to get rid of water vapor or other impurities thereon.

Figure 7:
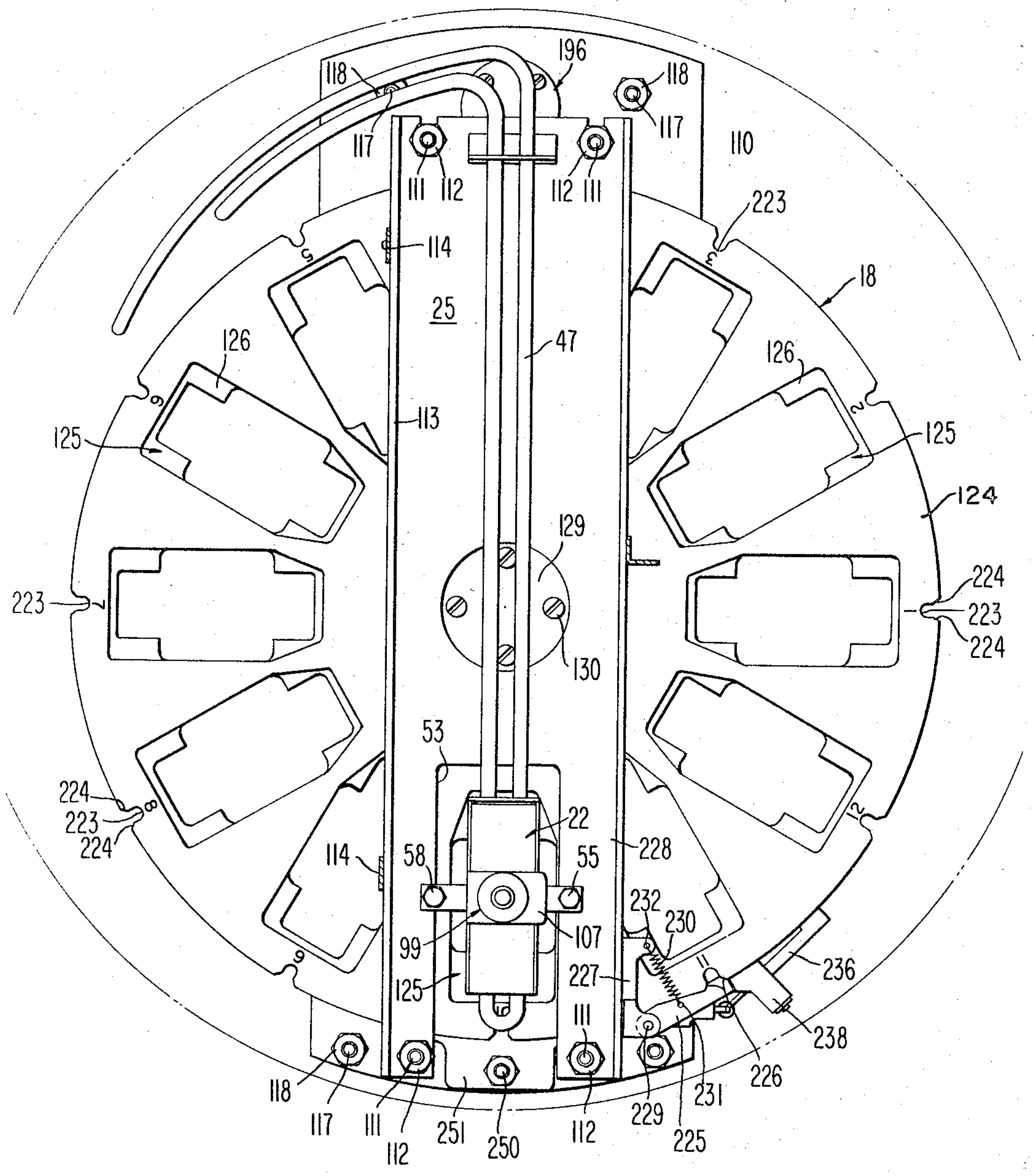
FIGURE 7 is a sectional view taken along the line 7—7 of FIGURE 1.

Since heat transfer in a vacuum is mostly by means of conduction, the lower body portion is provided with a pair of laterally extending mounting projections 50, 51 having a relatively small cross-sectional area in order to reduce to a minimum the flow of heat between the substrate holder and its supporting structure, channel platform 25, FIGURE 7. The platform includes a cutout portion 53 and the projections are supported on the top marginal edges thereof. The right projection includes a hole 54 and is secured down by bolt 55. The left projection 51 as seen in FIGURE 3 includes an elongated slot 56 and is held down by means of spring loaded washer 57 under the head of bolt 58. This construction allows lateral expansion of the lower body portion while its position is maintained by the hole 54 in the right projection 50 of the base.

Figure 4:
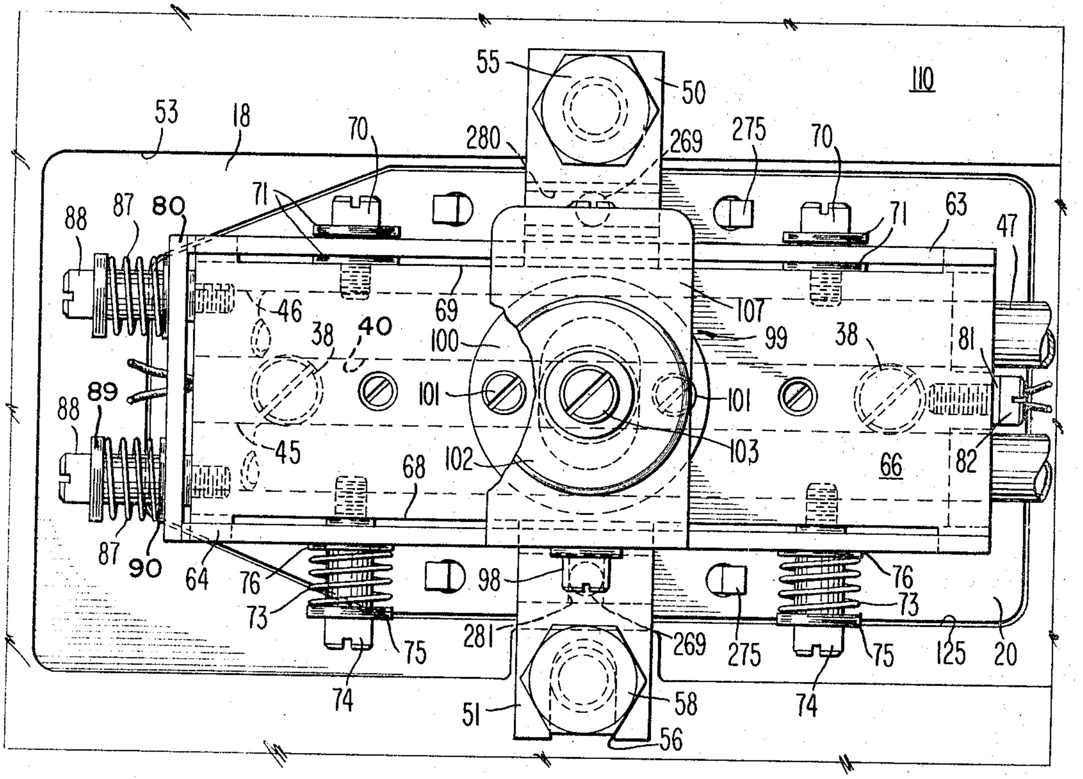
FIGURE 4 is a view taken along the line 4—4 of FIGURE 2 and illustrating the top of the substrate holder.

The substrate 24 is shown held up against the lower face 60 of the lower body portion 36 by a thin strip 62 fastened to each of the vertical side members 63, 64 of the assembly, the latter including vertical slots 65 for clearance with projections 50, 51. The thin strip 62 secured to one side member, extends inwardly toward the other member and acts as a spacer to separate the mask 17 from the substrate 24, by a small but fixed distance when the mask is in its raised position as seen in FIGURE 3. A top plate 66 having tabs at its corners, see also FIGURE 4, engages the two vertical side members 63, 64 in slots 67, FIGURE 2. The distance between the side edges 68, 69 of the top plate is such as to permit the side member 64 to slide and to be moved toward the opposed side member 63. Side member 64 is urged toward the side member 63 which is held in spaced relationship to the body 34 by means of bolts 70 and washers 71. Springs 73, encircling bolts 74 received in the opposite side of the body member 34 and retained thereon by washers 75 and bushing 76, FIGURE 4, act against the left vertical member 64 to push, FIGURE 3, the substrate 24 against the right vertical member 63. This arrangement overcomes problems of unequal widthwise expansion between the substrate 24 and the body 36 of the substrate holder assembly when the temperature is raised, and at the same time, provides for discrepancies in widths of the different substrates which may be employed.

In order to provide for similar expansion in the long direction of the substrate, a rear plate 80 is spring loaded toward the front end of the holder assembly 22. End stop 81 secured to the front face of lower body portion 36, FIGURE 6, by bolt 82 provides a fixed position for one end of the substrate. The rear plate 80, FIGURE 5, includes cutout portions 83 along opposite side edges thereof to engage tabs 84—84 of plates 63, 64 respectively. Tab 85 disposed along bottom edge of the rear plate engages the rear edge 86 of the substrate 24 to push the same toward the end stop 81 under the action of compression springs 87, see FIGURE 4, which encircle bolts 88 received in substrate body portion 36. One end of each spring reacts against the bolt through washer 89 and the other end transmits force forwardly to the plate through bushing 90. A generally V-shaped cutout 91 disposed along the top edge of the plate enables the rear cartridge heater 41 to be inserted in the lower body portion 36 of the substrate holder assembly. Elongated cutouts are provided in the lower edge of the plate 80 to permit the same to move along the axis of the bolts and also vertically in a manner to be hereinafter described.

In order to facilitate insertion and removal of the substrate from its holder and to cause the same to be held in tight contact with the lower surface 60 of the lower body portion 36, FIGURE 3, a compression spring 92 is mounted in recess 93 within the upper body portion 35 of the holder. The spring encircles a threaded post 94 received in threaded bore 95 which is coaxial with recess 93. The top of the spring exerts a force on the under surface of the top plate 66 and is effective to urge the two vertical side plates 63, 64 upwardly. To accommodate this vertical movement the side plates include elongated holes 97 to permit movement of the same relative to bolts 70, and the upper plate bolts 98.

A two part thumb operated cam 99 surrounds the upper portion of the post 94, FIGURE 3. The lower flange portion 100 is affixed to the top plate 66 as by screws 101, FIGURE 4, and the upper knob portion 102 of the cam is suitably secured as by bolt 103. When the knob portion 102 is rotated about the axis of the post, the camming surface 104 of the knob, FIGURE 2, engages the camming surface 105 of the flange portion which pushes the top plate 66 down against the compression spring to compress the same. This enables the vertical side plates 63, 64 and the substrate carried by the lower portion of the side plate to be dropped below the end stop 81, dotted outline portion in FIGURE 6. The left vertical side plate, FIGURE 3, includes an extension 107 which extends at a right angle to the plate and overlays a spaced distance the top plate 66 of the holder. The extension includes an elongated slot 108 to permit the passage of the cam surrounding the post so that when the upper extension 107 of the side plate is thereafter depressed in the direction of arrow A, the vertical side plate 64 is fulcrumed backwardly about the top left edge of the top plate 66 as seen in FIGURE 6. This removes the side loading due to springs 73 on the left side of the substrate and permits the same to be slipped forward beneath the end stop 81 on the front of the body. A new substrate may replace the one which was removed in a reverse fashion.

Referring to FIGURES 1 and 7, the channel platform 25 which supports the substrate holder assembly 22 is supported upon and above an intermediate stationary plate 110 by means of four stub posts 111 received in the four corners of the platform and secured thereto by nuts 112. Upstanding flanges 113 of the platform and bracket 114, support the coils of a Meissner tube 115. This tube enables a source of gas such as nitrogen and heated air to be pumped through the coil in a manner as thoroughly described in the previously referred to copending application of Simmons et al., Ser. No. 238,165. The intermediate stationary plate 110 having a cutout 116 to permit passage of the evaporant therethrough is in turn supported on and above the base 10 of vacuum chamber by means of four rods 117 and nuts 118, see FIGURE 8. The stationary plate 110 is centrally apertured as at 120, see FIGURES 2 and 7, to receive therein a bearing mounting flange 121, the latter secured thereto by bolts 122. The previously referred to mask holder turret 18 includes a circular plate 124 having a plurality of radially disposed apertures 125 which include a step or shoulder portion 126 around the marginal edges thereof for receiving the previously referred to mask 20. A stub shaft 128 disposed along the axis of rotation of the circular plate 124 includes a flange 129 secured to the plate as by bolts 130. The shaft 128 is journalled for rotation in bore 132 of bearing mounting flange 121 by means of upper and lower bearings 133, 134 which are secured in position by bearing retainer 135 and nut 136. The nut in turn is received upon threaded portion 137 of the shaft and locked in place by set screw 138. The lowermost portion of the shaft is reduced in diameter as at 140 to receive a gear 141 thereon. A key 142 locks the gear on the shaft and causes the previously referred to heater turret to be rotated in a manner to be later described. Screw 143 and washer 144 prevent movement of the gear along the axis of rotation of the shaft.

Referring now to FIGURE 1 the previously referred to heater turret assembly 14 includes a lower bearing race 145 mounted upon the top plate 11 of the base 10 of the vacuum chamber by a plurality of standoffs 146, each of the latter having at one end thereof a threaded stud 147 which is received in aperture 148 of the top plate. The upper end of each standoff likewise includes a top stud portion 149 which is received in aperture 150 of the lower bearing race 145 and is secured by means of a nut 152. The central portion of the bearing plate includes an enlarged aperture 153 which is in line with the pump flange 154 to permit pump-down of the vacuum chamber.

A turret base flange 155, having a bore 156 coaxially aligned with bore 153, including an upper bearing race 157 complemental with that of bearing plate 145 to receive bearings 158 therebetween. A plurality of circular clamps 159 only one of which is shown for clarity of illustration embraces the turret base 155 and the lower bearing race plate 145 to prevent the turret from being accidentally lifted or tilted off and is secured to the lower bearing race plate as by screws 160. The upper portion of the turret base 155 is recessed as at 162 to constitute a shoulder for supporting and positioning an annular turret base plate 163, which is mounted to the turret base 155 by bolts 164. The turret base plate supports twelve heater units 16, previously referred to, which are radially disposed and in alignment with the twelve masks 20 carried by the mask turret 18 described above. Each heater unit 16 includes a boat contact 165 supported for electrical interconnection in a manner to be described in greater detail hereinafter. A tapered four-sided chimney 168 having slots 169 encloses a portion of the boat contact 165 to conduct vaporized material to the mask supported upon the turret 18 above. The boats 167 of the different units 16 may carry different materials such as gold, aluminum, copper or other materials and the amount of current passed through a contact post 165 and corresponding ground post 166 depends upon the particular metal which is to be deposited. Thus one metal would use a low current and another a high current. If for example, it is desired to evaporate aluminum, a current sufficient to heat the boat to 800° C. would be required, whereas to evaporate platinum, 2300° C. would be required. Electrical potential for energizing the boats of the individual heater units may be provided by selectively actuating the electrical feed-through unit 30. The description of the boats 167, their equivalents, and the operation of the electrical feed-through unit 30 as well as the rotary magnet feed-through apparatus 28 are fully illustrated and described in the previously referred to copending application to Simmons et al. Each contact post 165 is shown extending through an aperture 170 in the circular heater base plate 163 and includes a flange 171 transverse to its lower end which is fastened to a block of electrically insulative material 172 as by bolts 173. The upper portion of each block is likewise fastened to the lower surface of the base plate 163 by bolts 174.

In a similar manner the ground post 166 includes flange 175 in turn secured to the top surface of the heater plate as by bolts 176. Each chimney 168 is suitably secured to transverse strip 178 and is supported on the heater plate 163 by means of a block 179 and bolts 180. The bolts are shown passed through the block strip and plate and secured on the under surface of the latter. The aforementioned slots 169 in the side walls of the chimney 168 are provided for electrical isolation from the boat heaters 167.

Referring now to FIGURES 1 and 2, it can be seen that the twelve heater units 16 are aligned with the mask elements 20 of the mask turret 18 by the following construction. The upper portions of the chimneys 168 are shown projecting through radially disposed rectangular apertures 184 in the circular chimney support plate 183. The circular chimney plate 183 is connected to the lower drive coupling member 186 as by bolts 187, while the top coupling element 188 engages lower tooth portions 190 of the ratchet gear 141.

Rotary drive motion to rotate the heater turret 14 and mask turret 18 in unison is supplied from the rotary magnetic feed-through unit 28, FIGURE 1, previously referred to. Movement of pulley belt 193 in the appropriate direction through the magnetic unit will cause a like movement of the shaft 195 which extends upwardly and into the vacuum chamber. The upper end of the shaft is supported for rotation relative to the stationary plate 110, see also FIGURE 8, by means of bearing unit 196, which includes a ball bearing race 197, ball bearings 198, and a cover 199 secured to the plate by bolts 200. A small sprocket 201 is secured to the shaft 195 as by set screw 202 adjacent the lower surface of the stationary plate and is effective to drive the aforementioned shielding unit 26.

As previously stated, the shielding unit is effective to control the interval of time of vapor exposure from a given heater unit through its corresponding aligned mask. During the early stages of the heating of a particular material the shield unit is in blocking relationship with the chimney of a selected heater unit to prevent the evaporant from striking the substrates and contaminating the same. When the evaporant material is brought up to proper temperature, the shield unit assembly is rotated to permit the evaporant to pass through the mask supported on the mask turret so as to strike the substrate housed within substrate holder 14 to build up a layer of deposit thereon. The shield assembly 26 includes an enlarged circular plate 205 having gear teeth 206 about its periphery, FIGURES 2 and 8, to engage the sprocket 201 mounted on shaft 195. The gear shield plate 205 is secured to gear flange 207 by bolts 208. The gear flange 207 in turn is journalled for coaxial rotation about the outer surface of bearing mounting flange 121 by upper and lower sets of bearings 209, 210 interposed between the gear flange and the bearing mounting flange. The bearings are secured in place by bearing retaining ring 211 and threaded nut 212 which is secured in place by set screw 213.

Figure 11:
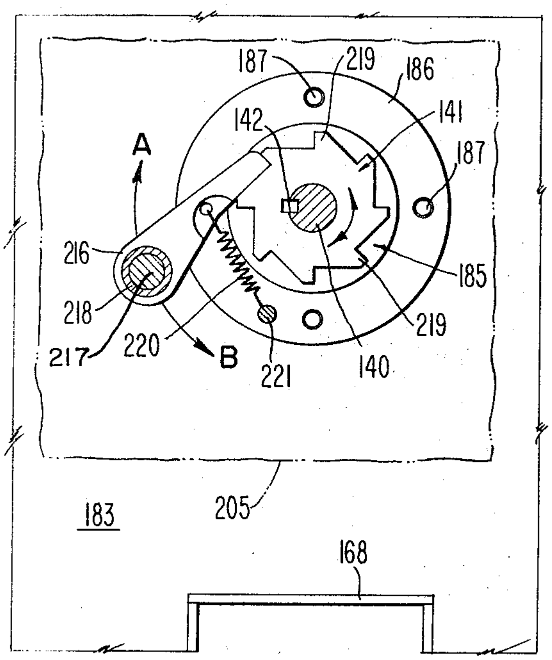
FIGURE 11 is a view taken along the line 11—11 of FIGURE 2 showing the ratchet arrangement for rotating the heater and mask assemblies.

Referring now to FIGURES 2 and 11, the lower surface of gear plate 205 has suitably affixed thereto a support 215 depending therefrom. A pawl 216 is pivoted to the support by means of pivot pin 217 and bushing assembly 218. As seen in FIGURE 11, the pawl 216 is urged into engagement with the teeth 219 of the ratchet gear 141 by means of spring 220 secured at one of its ends to the pawl and at its other end to a post 221 secured to the pawl support 215. Movement of gear plate 205 in the direction of the arrow A bodily moves the pawl and rotates the ratchet gear 141 in the same direction. This movement causes both the mask turret 18 and the heater assembly 16 to rotate in unison. However, when the pawl 216 carried by plate 205 is moved in the direction of arrow B, FIGURE 11, the ratchet gear 141, heater turret 16 and mask turret 18 remain stationary as the pawl overrides or ratchets around the gear 141.

Referring now to FIGURE 7, the mask turret 18 is shown as including an indexing notch 223 radially aligned with each mask receiving recess 125 and corresponding to a numbered location from 1 to 12 inclusive, of a particular heater unit 16 and its associated mask element 20. Each notch opens from the periphery of the turret plate 18 and includes opposed divergent cam-like surfaces 224 along the outer marginal edges of the notch. When the mask turret 18 and the heater unit turret 14 are rotated in unison as before described, by the rotary magnet feed-through device 28, a pawl 225 located adjacent the periphery of the turret 18 is caused to engage each such notch to provide a coarse location of the mask turret relative to the substrate holder 22 above. The pawl includes divergent surfaces 226 at one end thereof which engage the surfaces 225 of the notch. A bracket 227 mounted upon flange 228 of channel platform 25 by means of pivot 229 supports the pawl for pivotal movement for engagement into and out of the successive notches. A spring 230 secured at one of its ends as at 231 to the central portion of the pawl and at its other end 232 to the bracket 227 is effective to urge the pawl into seating engagement with each such notch. When sufficient rotative force is applied to the turret by said rotary feedthrough 28, the pawl is caused to be disengaged from its associated notch aided by the divergent cammed surfaces 224, 225 of the notch and pawl.

Figure 8:
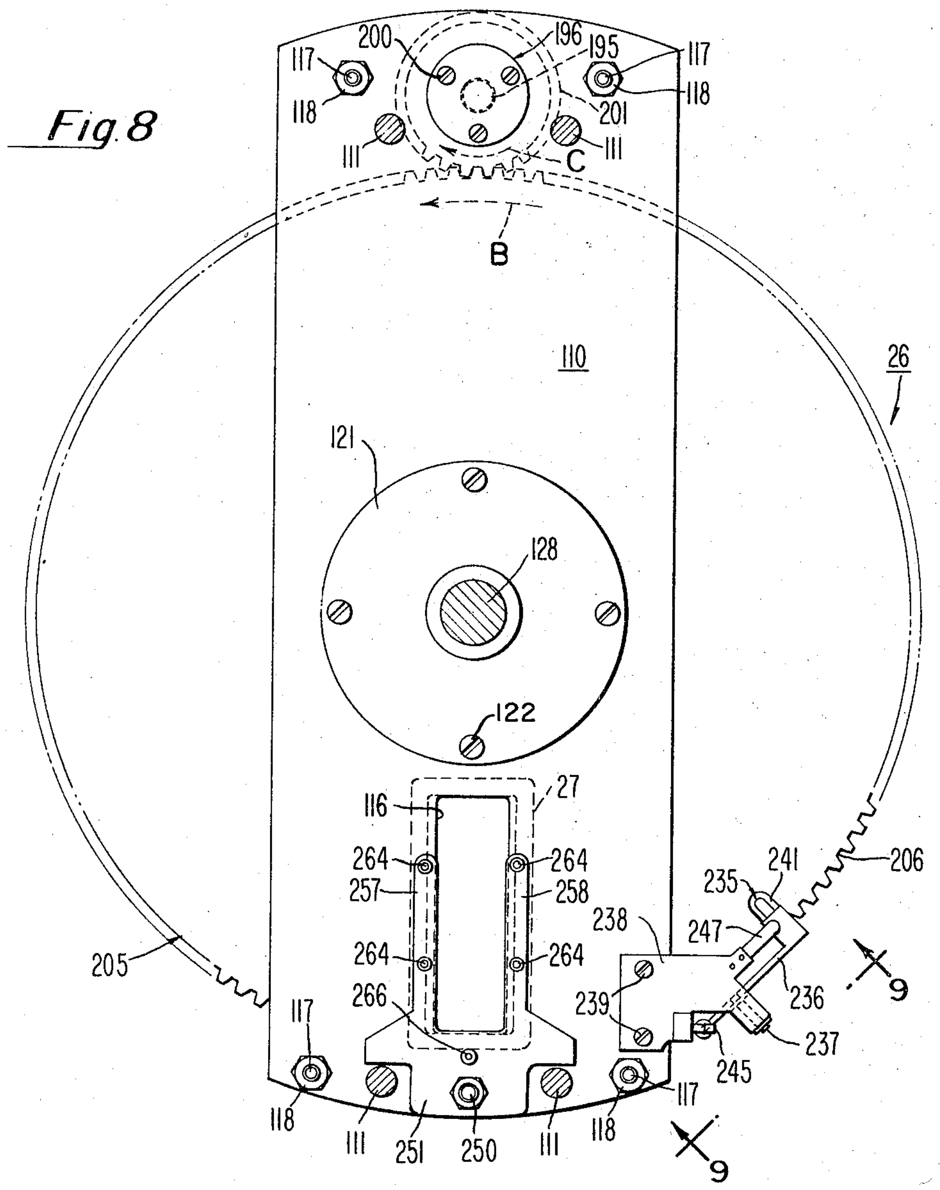
FIGURE 8 is a sectional view taken along the line 8—8 of FIGURE 1.
Figure 9:
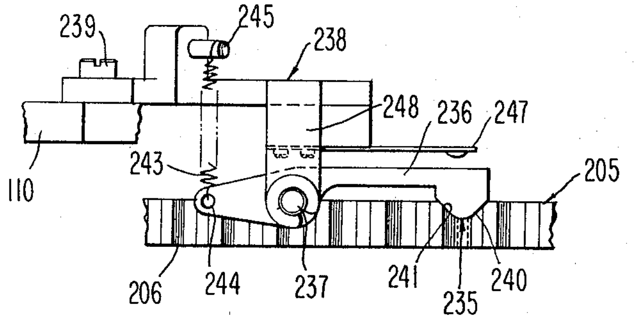
FIGURE 9 is a view taken along the line 9—9 of FIGURE 8 illustrating detent means for positioning the mask holder.

Referring now to FIGURES 8 and 9, a similar pawl arrangement is provided to locate the vapor shield assembly 26 which as previously stated is utilized to control the time interval during which the evaporant is permitted to build up on the substrate 24. For this purpose an enlarged notch 235 is provided in the peripheral edge of the vapor shield. A pawl 236 is disposed adjacent the gear teeth 206 of the shield plate 205 and is mounted for pivotal movement by pivot 237 upon mounting bracket 238 which is secured on stationary plate 110 by bolts 239. The pawl is mounted for movement in a plane normal to the top surface of the plate 205 so that one end thereof having tapered surfaces 240 engage bevelled edge 241 of notch 235. A tension spring 243 secured at one of its ends to pawl 236 as at 244 and at its other end to post 245 on bracket 238 normally urges the pawl to pivot in a direction tending toward engagement with the notch. An electrical contact 247 shown in FIGURE 9 in its open state is affixed at one of its ends to the under surface of the bracket 238 as at 248 and is provided to record the time interval during which the evaporant is passing through the aperture 27.

It can thus be seen from the foregoing description that when the rotary magnet feed-through is rotated so that the sprocket 201 is rotated in the direction of arrow C, the shield plate gear will then be rotated in the direction of arrow B until the rectangular aperture 27 may be alinged with a selected heater unit. In this position the pawl 236 is in engagement with notch 235 of the plate. When it is desired that the plate be in blocking relationship with the heater unit a sufficient force is applied to rotate the plate so that the pawl is forced out of the notch due to the slope of the surfaces 240, 241. The pawl thereafter rides on top of the plate and the electrical contact 247 is in close contact with the pawl.

When a selected heater unit 16 bearing the desired material is aligned with the substrate above for deposition thereon, the mask 20, FIGURE 2, may be lifted so the same is in close facing relationship with the substrate as shown in FIGURE 3, by means of the mask lifting assembly 32, previously referred to. This assembly includes a push-pull rod 250 having a bifurcated or fork member 251 secured to the top portion of the rod. The fork, see also FIGURE 2, includes an aperture as at 252 to receive the threaded end 253 of the push-pull rod. A nut 254 secures the fork against the shoulder 255 formed by the threaded portion 253 of reduced diameter. Upward or vertical movement of the push-rod 250 is constrained by means of bushing 256 secured in stationary plate 110. The fork member 251 includes first and second arms 257, 258 in FIGURES 3 and 8, each arm further including a pair of spring loaded pins 260 spaced along the length of each arm, with the pins on opposite arms being in opposed relationship to each other. Each pin is received in an aperture 261 in its respective arm and includes on its lower end a grooved washer 262. A compression spring 263 is inserted between the shoulder formed by the headed top portion 264 of the pin, see FIGURE 2, and the top surface of its associated fork arm. The base of the fork 251, e.g., its U-shaped portion, includes a pin 266 which engages one of the numbered indexing slots 223 radially opposite to the mask holding recess 125 in the mask holding plate 18. The top of the pin 266 is tapered as at 267 to enable a slight camming action of the mask holder plate 18 as the fork is raised. In the event that the mask holder plate is not in the correct position, the pin prevents the fork from contacting the mask. During upward movement of the mask lifting assembly 32 the four spring loaded pins 260 on the fork member 251 pass through the mask aperture 125 in the mask plate 18 to engage the lower surface of the mask 20.

Figure 10:
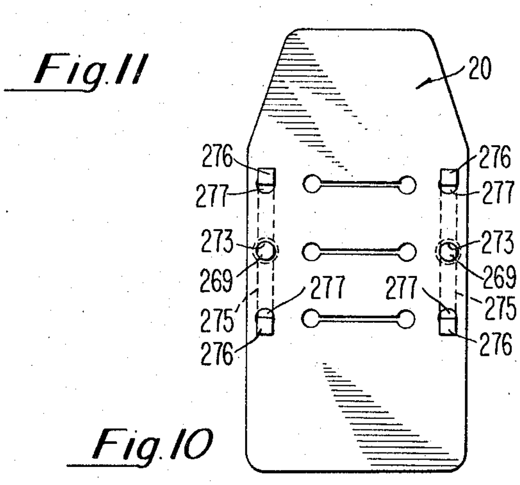
FIGURE 10 is a plan view showing a typical mask element of the type which can be positioned adjacent the substrate.

Each mask contains two pins 269, one on each side of the mask, see also FIGURE 10. Each pin includes a lower headed portion 270 adjacent the lower surface of the mask and a tapered upper end projecting above its upper surface. The shank of each pin is received in aperture 273 of the mask and constitutes a very close sliding fit therewith. Each pin 269 is held in its mask 20 by means of an elongated spring clip 275 which engages the headed end of the pin adjacent the lower surface of the mask. The opposite extremities 276, FIGURE 10, of the spring clip are passed upwardly through holes 277 of the mask and are then bent to overlay the top surface of the mask adjacent the margins of the latter holes.

With reference now to FIGURE 3 it is seen that mounting projection 50 extending from the lower body portion 36 of the substrate holder assembly includes a tapered hole 280 in the lower surface thereof and the lower surface of the mounting projecting 51 includes a tapered slot 281 the axis of which is extended transversely across the substrate holder to intersect the axis of the tapered hole. As the mask 20 is lifted so that its upper face engages the strips 62 on the substrate holder, the rightmost tapered pin 269 of the mask engages its mating tapered hole 280 while the left pin of the mask engages the elongated tapered slot 281.

Pins 269 and the material of the mask 20, in general, expand and contract like amounts when subjected to changes in temperature so that tolerances between pins 269 and the holes 273 in which the same are received remain relatively constant. The spring clips 275 which engage the heads of the pins 269 as well as the springs 263 which encircle pins 260 of fork member 251 enable substrates 24 of different thicknesses to be employed in the substrate holder. Slot 281 extending in a transverse direction in the lower surface of projection 51 allows for expansion and contraction of the substrate holder 22, particularly body 36 thereof with respect to the mask element 20. It can further be seen that the tapered ends of pins 269 on opposite sides of the mask moreover guide the mask into proper alignment and eliminate tolerance problems of pins fitting into holes which change diameters with temperature. Thus clearly the diametrical fit between pins 269 and their holes 273 in mask 20 is not affected by temperature changes since each is at the same temperature at the time of use.

With reference now to FIGURE 1, the lower end of the push-pull rod 250, which raises and lowers fork member 251, is shown fastened to electrical connector rod 380 by means of ring-like clamp or collar 283 which extends therebetween. Insulative bushings 284 received in the threaded extremity 285 of the rod of reduced diameter and secured by nut 286 prevents electrical current flow from the pull-rod. When the electrical connector rod 380 is raised by the electrical feed-through apparatus 30, from its full line position to its dotted line position as shown in the manner as fully described in the previously referred to copending application to Simmons et al., a suitable source of electrical current is provided to contact post 165. Simultaneously, with such upward movement the mask 20 above is lifted into very close facing relationship with the substrate 24 by means of the fork member 251. Electrical current is thereby caused to flow to the opposite ground post 166 through the boat heater 167 to cause evaporation of the material therein. The current then flows from the turret plate 163 to bracket 287 affixed to the surface of the rightward portion of the plate, thence downwardly through rod 288 affixed at its upper end to bracket 287 and at its lower end to base plate 10. A bracket 289 affixed to the lower surface of base plate 10 and adjacent to the lower end of rod 288 is provided for connection with a suitable ground source.

While there has been described what at present is considered to be the preferred embodiment of the invention, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. In vacuum deposition apparatus having a vacuum chamber, the combination comprising: means supporting a workpiece for successive depositions of different materials thereon, means supporting a plurality of heater units each having a material to be vaporized, mask means movable with said heater supporting means, said mask means having a mask element for each heater unit, feed-through means for indexing said heater supporting means and said mask means so that a selected heater unit and mask element are aligned with said workpiece, and electrical feed-through means for energizing said aligned heater unit to cause the material supported thereby to be vaporized and for moving the selected mask element into facing contact with said workpiece supporting means.

2. In vacuum deposition apparatus having a vacuum chamber, the combination comprising: means supporting a workpiece, rotary means supporting a plurality of heater units each adapted to support a material to be evaporated successfully on said workpiece, said heater units including electrical contact means for passing electrical current through said materials supported thereby, mask means rotatable with said rotary means and supporting a plurality of mask elements one individual to each said heater unit, electrical feed-through means for passing current to a selected heater unit, rotary feed-through means for indexing said rotary means relative to said workpiece and said electrical feed-through means so that electric current may be succesively passed through the electrical contacts of a selected heater unit to cause the material supported thereby to vaporize, and means movable by said electrical feed-through means for engaging the selected mask element to move the same into facing contact with said workpiece.

3. In vacuum deposition apparatus having a vacum chamber, the combination comprising: means supporting a workpiece, rotary means supporting a plurality of heater units, each said unit having electrical contacts for supporting a material therebetween, mask means rotatable with said rotary means and supporting a plurality of mask elements therein, electrical feed-through means for passing current through the electrical contacts of a selected heater unit to cause vaporization of the material supported therebetween, rotary feed-through means for indexing said rotary means relative to said workpiece and said electric feed-through means, means for moving said mask elements parallel to the axis of said rotary means and having a U-shaped base member with arms extending therefrom, spring loaded pins mounted on said arms and adapted to engage the marginal edges of a selected mask element, and means interconnecting said mask element moving means and said electrical feed-through means whereby movement of the latter causes said selected mask element to be moved into facing relationship with the workpiece.

4. In vacuum deposition apparatus having a vacuum chamber, the combination comprising: means supporting a workpiece, means supporting a plurality of heater units, each adapted to support a material to be evaporated therefrom, mask support means associated for movement with said supporting means for said heater units, and carrying a plurality of mask elements one for each heater unit, electrical feed-through means for moving said heater units and said mask means, shield means mounted for interposition between said mask means and said heater units to block the evaporant from the latter and in another position of movement to permit the evaporant to pass through the mask element onto the workpiece, means movable by said electrical feed-through means for engaging a selected mask element to move the same into facing relationship with said workpiece, said last means including spring loaded pins engageable with one surface of the selected mask element and effective to push the opposite surface of said element into facing relationship with said work supporting means under the compression of the springs associated with said pins, and means associated with said feed-through means for moving said shield means out of alignment with said mask means.

5. The combination is set forth in claim 4 wherein said means for moving said shield means includes ratchet means for moving said shield means in one direction.

6. In vacuum deposition apparatus having a vacuum chamber, the combination comprising: means supporting a workpiece for receiving successive depositions of different materials thereon, means supporting a plurality of heater units each having means for evaporating a material, mask element supporting means movable with said heater supporting means, shield means normally interposed to block the evaporant from said heater units, means for indexing a selected heater unit and mask element into alignment with the workpiece, means associated with said indexing means for moving said shield means out of evaporant blocking relationship with the selected heater unit, and electrical feed-through means for energizing the selected indexed heater unit to evaporate the material thereof and to move the mask associated with said heater unit into aligned facing relationship with said workpiece whereby the material vaporized from said heater unit is deposited on said workpiece through said mask element.

7. In vacuum deposition apparatus having a vacuum chamber, the combination comprising: means for supporting a workpiece onto which successive different materials may be deposited, means supporting a plurality of heater units and a like plurality of mask elements, said means for supporting said heater unit including an aligning slot for each heater unit and mask, each heater unit including contacts for supporting a material and passing electrical current through the same, indexing means for moving a selected heater unit and mask element into alignment with said work supporting means, electrical feed-through means connectible with a contact of said heater unit to pass electric current through the material supported thereby, lifting means associated with said electrical feed-through means for lifting the selected mask element from the second named supporting means and into engagement with said workpiece supporting means, and including pin means for engagement with the aligning slot adjacent the selected heater unit.

8. In vacuum deposition apparatus, the combination comprising: means for supporting a workpiece to receive depositions of material thereon, means for evaporating said materials, means for supporting a plurality of mask elements, means for indexing said mask element supporting means so that a selected element thereon is aligned with the workpiece, said workpiece supporting means including a tapered hole adjacent one marginal edge of the workpiece and a slot formed with converging faces adjacent the opposite marginal edge thereof, said selected mask element having a pair of pins with tapered ends for engagement with said tapered hole and slot, and electrical means associated with said evaporating means for moving said selected mask element toward said workpiece supporting means to cause engagement of said pair of pins with said tapered hole and slot.

9. In vacuum deposition apparatus, the combination comprising: means for supporting a workpiece to receive depositions of material thereon, means for evaporating said materials, means for supporting a plurality of mask elements, means for indexing said mask element supporting means so that a selected element thereon is aligned with the workpiece, said workpiece supporting means including spaced tapered indentations in one surface thereof, said selected mask element having movable elements with tapered ends for engagement with said tapered indentations, and means for moving said selected mask element toward said workpiece supporting means to cause engagement of the tapered ends of said movable elements with said tapered indentations and to cause relative movement between said mask element and said movable pins.

10. In vacuum deposition apparatus having a vacuum chamber the combination comprising: means supporting a substrate for successive depositions of material thereon, heater means for evaporating a plurality of materials and a plurality of detachable mask elements associated therewith, means for moving a selected mask element into alignment with said substrate, said substrate supporting means including a body, side plate means having strips in overlapping relationship with one surface of said body portion for engaging said substrate therebetween, means for urging said side plates in one direction normal to said one surface to increase the distance between said strips and said one surface, and means for returning said side plate to said initial position wherein said substrate is urged in facing contact with a said one surface, said surface of said body including undercut surfaces, each said mask element including projecting portions for complemental engagement with said undercut surfaces, and electrical means movable to energize said heater means and to cause the projections of said selected mask element to be moved into mating engagement.

11. The combination as set forth in claim 10 wherein said means for urging said side plate means in one direction include top plate means secured to said plate means, cam means associated with said top plate means for urging said side plate means in one direction, and wherein said means for returning said side plate means to said initial position include spring means interposed between said top plate means and said body portion.

12. The combination as set forth in claim 10, and including means integral with and extending from one of said side plates, whereby manual depression of said integral means causes said one side plate to be positioned divergently with respect to the other side plate.

13. The combination as set forth in claim 10 wherein said substrate supporting means includes: means at one end of said body portion, end plate means connected with said side plate means for limited movement with respect thereto and engageable with an edge of said substrate, and spring means associated with said end plate means for urging the substrate against said stop means.

14. In vacuum deposition apparatus having a vacuum chamber, the combination comprising: means supporting a substrate for successive depositions of material thereon, electrical contact means for supporting a plurality of materials to be evaporated, means supporting a plurality of mask elements for controlling the patterns of deposition on said substrate, said substrate supporting means including a body portion having a lower surface for engagement with said substrate, a pair of side plates enclosing said body portion for engaging said substrate therebetween, said side plate means having strips extending in overlapping relation relative to the lower surface of the body portion to retain said substrate between said strips and said lower surface, means for urging one of said side plates of said pair toward the other, means for urging said pair of side plates so that the substrate engaged therebetween is in facing contact with said lower surface of said body portion, said body portion having a tapered hole adjacent one plate of said pair and a slot having tapered surfaces adjacent the other plate of said pair, said mask elements including tapered pins disposed along opposite marginal edges thereof, electrical means for energizing said electrical contact means and including means for moving a mask element into facing relationship with said substrate, whereby a tapered pin disposed along one edge of said mask is caused to enter said tapered hole and another pin disposed along an opposite edge of the mask is caused to enter the tapered slot to thereby align said mask with said substrate.

15. In vacuum deposition apparatus, the combination comprising: means for supporting a substrate for deposition of material thereon, means for evaporating a plurality of materials, means for supporting a plurality of mask elements for controlling the patterns of depositions on the substrate, said substrate supporting means including a body having a surface for engagement with said substrate, movable side members engaging outer surfaces of said body, means for urging one of said side members toward an opposed member for gripping said substrate therebetween, means normally urging said side members in a direction to cause said substrate to contact the surface of said body, and means for moving said side members in an opposite direction to cause said substrate to be spaced from the surface of said body, means associated with one said side member to cant said member relative to the side member opposed thereto to permit removal and insertion of said substrate, said substrate body including undercut surfaces, said mask elements each including projecting complemental surfaces for mating engagement with said undercut surfaces, and means for moving a selected mask element so that the projecting surfaces thereof are received in mating engagement with said undercut surfaces of said supporting means.

References Cited by the Examiner

UNITED STATES PATENTS

| | | | |
|---|---|---|---|
| 2,284,972 | 6/1942 | Carson | 269—13 |
| 2,745,773 | 5/1956 | Weimer | 118—49 X |
| 2,793,143 | 5/1957 | Kohring | 118—49 X |
| 3,023,727 | 3/1962 | Theodoseau et al. | 118—49 X |
| 3,228,794 | 1/1966 | Ames | 118—49 X |
| 3,238,918 | 3/1966 | Radke et al. | 118—49.1 |

MORRIS KAPLAN, *Primary Examiner.*